US012550262B2

(12) United States Patent
Keiler et al.

(10) Patent No.: US 12,550,262 B2
(45) Date of Patent: Feb. 10, 2026

(54) VGA MONITOR EMULATING PRINTED CIRCUIT BOARD

(71) Applicant: Alcon Inc., Fribourg (CH)

(72) Inventors: Horst Keiler, Potsdam (DE); Martin Eil, Berlin (DE)

(73) Assignee: ALCON INC., Fribourg (CH)

( * ) Notice: Subject to any disclaimer, the term of this patent is extended or adjusted under 35 U.S.C. 154(b) by 258 days.

(21) Appl. No.: 18/450,795

(22) Filed: Aug. 16, 2023

(65) Prior Publication Data

US 2024/0064903 A1 Feb. 22, 2024

Related U.S. Application Data

(60) Provisional application No. 63/371,957, filed on Aug. 19, 2022.

(51) Int. Cl.
*H05K 1/16* (2006.01)
*H05K 1/02* (2006.01)
*H05K 3/30* (2006.01)

(52) U.S. Cl.
CPC ........... *H05K 1/167* (2013.01); *H05K 1/0286* (2013.01); *H05K 3/306* (2013.01); *H05K 2201/10007* (2013.01)

(58) Field of Classification Search
CPC ....... H05K 1/167; H05K 1/0286; H05K 3/306
See application file for complete search history.

(56) References Cited

U.S. PATENT DOCUMENTS

2008/0204373 A1* 8/2008 Sutton .................... G09G 5/006 345/60
2008/0204594 A1* 8/2008 Sutton .................... G09G 5/006 348/E7.003
2009/0024380 A1 1/2009 Huang

FOREIGN PATENT DOCUMENTS

CN 210745660 U 6/2020
JP H06267791 A 9/1994
KR 20100104810 A 9/2010
KR 101334291 B1 11/2013

OTHER PUBLICATIONS

Wikipedia; VGA Connector (DE-15/HD-15); Printed Jun. 14, 2022; retrieved from https://en.wikipedia.org/w/index.php?title=VGA_connector&oldid=1091484838.

* cited by examiner

*Primary Examiner* — Jeremy C Norris

(57) ABSTRACT

A printed circuit board comprises a substrate as well as resistors and electrical connections disposed on the substrate. The substrate couples to a video graphics array connector that has pins, including video pins and return pins. A video pin transmits a video signal, and a return pin provides a ground for a corresponding video pin. The substrate has openings, where each opening can receive a pin. The resistors and the electrical connections couple to a subset of the pins to mimic an external video graphics array monitor. The resistors comprise: a red connection resistor that can couple a red video pin with a red return pin; a green connection resistor that can couple a green video pin with a green return pin; and a blue connection resistor that can couple a blue video pin with a blue return pin.

19 Claims, 3 Drawing Sheets

VGA CONNECTOR 12
PCB 10
16 SHIELD
14 PINS
19 SUBSTRATE
PCB 10
RESISTOR 22c
RESISTOR 22b
RESISTOR 22a
5 4 3 2 1
10 9 8 7 6
15 14 13 12 11
20 OPENINGS

VGA MONITOR EMULATING PRINTED CIRCUIT BOARD

TECHNICAL FIELD

The present disclosure relates generally to VGA accessories, and more particularly to a VGA monitor emulating printed circuit board.

BACKGROUND

A Video Graphics Array (VGA) is a video display controller and graphics standard that operate as an interface between a computer and a video monitor. A VGA cable is the compatible cable that connects the computer and monitor to allow the computer to display graphics on the monitor.

BRIEF SUMMARY

In certain embodiments, a printed circuit board comprises a substrate as well as resistors and electrical connections disposed on the substrate. The substrate couples to a video graphics array connector that has pins, including video pins and return pins. A video pin transmits a video signal, and a return pin provides a ground for a corresponding video pin. The substrate has openings, where each opening can receive a pin. The resistors and the electrical connections couple to a subset of the pins to mimic an external video graphics array monitor. The resistors comprise: a red connection resistor that can couple a red video pin with a red return pin; a green connection resistor that can couple a green video pin with a green return pin; and a blue connection resistor that can couple a blue video pin with a blue return pin.

Embodiments may include none, one, some, or all of the following features: Each resistor has a resistance between 30 to 150 Ohms. The axis of an opening is set at an angle of 1 to 20 degrees relative to the axis of the corresponding pin. The axis of an opening is translated 0.01 to 0.5 millimeters relative to the axis of the corresponding pin. An opening has one or more protrusions configured to secure a pin. The protrusion may have an angular edge pointing towards the center of opening. The substrate is sized and shaped to fit within a pin shield of the video graphics array connector.

In certain embodiments, a printed circuit board comprises a substrate as well as a set of resistors and a set of electrical connections disposed on the substrate. The substrate couples to a video graphics array connector that has pins, including video pins and return pins. A video pin transmits a video signal, and a return pin provides a ground for a corresponding video pin. The substrate has openings, where each opening can receive a pin. The resistors and the electrical connections couple to a subset of the pins to mimic an external video graphics array monitor. Each resistor can couple a video pin with a corresponding return pin.

Embodiments may include none, one, some, or all of the following features: The set of resistors comprises a red connection resistor that can couple a red video pin with a red return pin. The set of resistors comprises a green connection resistor that can couple a green video pin with a green return pin. The set of resistors comprises a blue connection resistor that can couple a blue video pin with a blue return pin. Each resistor has a resistance between 30 to 150 Ohms. The axis of an opening is set at an angle of 1 to 20 degrees relative to the axis of the corresponding pin. The axis of an opening is translated 0.01 to 0.5 millimeters relative to the axis of the corresponding pin. An opening has one or more protrusions configured to secure a pin. The protrusion may have an angular edge pointing towards the center of opening. The substrate is sized and shaped to fit within a pin shield of the video graphics array connector.

In certain embodiments, method for mimicking an external video graphics array monitor includes coupling a printed circuit board to a video graphics array connector that has pins, including video pins and return pins. A video pin transmits a video signal, and a return pin provides a ground for a corresponding video pin. The printed circuit board comprises a substrate as well as resistors and electrical connections disposed on the substrate. The substrate couples to the video graphics array connector. The substrate has openings, where each opening can receive a pin. The resistors and the electrical connections couple to a subset of the pins to mimic an external video graphics array monitor. The resistors comprise: a red connection resistor that can couple a red video pin with a red return pin; a green connection resistor that can couple a green video pin with a green return pin; and a blue connection resistor that can couple a blue video pin with a blue return pin.

Embodiments may include none, one, some, or all of the following features: The axis of at least one opening is set at an angle of 1 to 20 degrees relative to the axis of the corresponding pin. The axis of at least one opening is translated 0.01 to 0.5 millimeters relative to the axis of the corresponding pin.

DESCRIPTION OF EXAMPLE EMBODIMENTS

Figure 1:
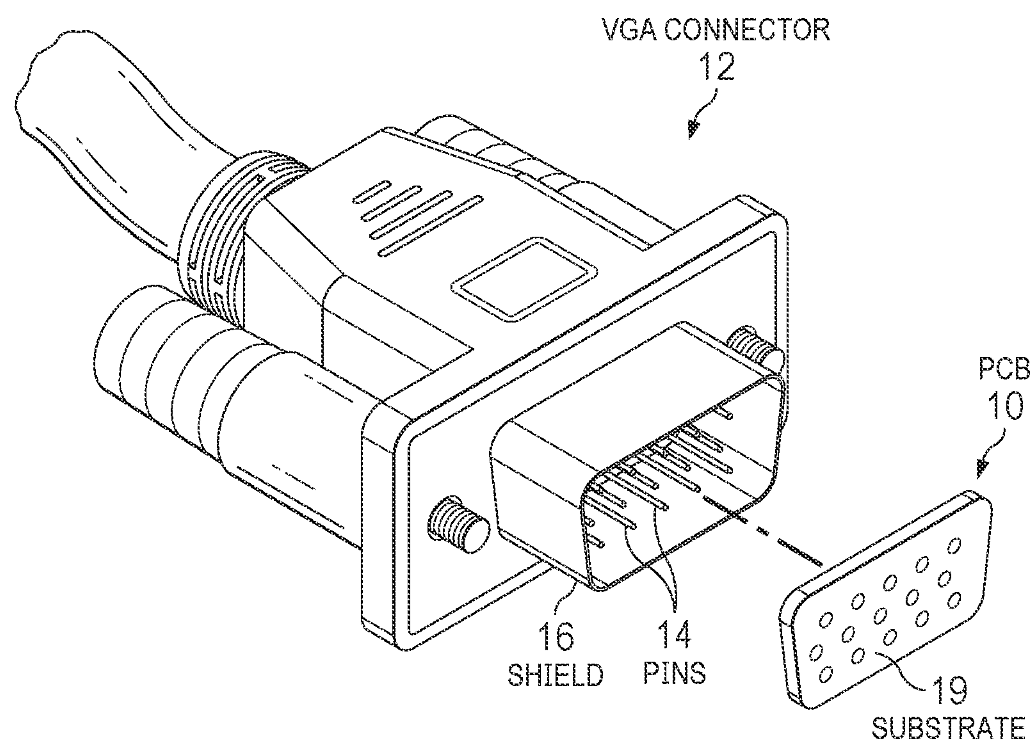
FIG. 1 illustrates an example of a printed circuit board (PCB) that can be used with a video graphics array (VGA) connector to emulate an external monitor, according to certain embodiments.

Referring now to the description and drawings, example embodiments of the disclosed apparatuses, systems, and methods are shown in detail. The description and drawings are not intended to be exhaustive or otherwise limit the claims to the specific embodiments shown in the drawings and disclosed in the description. Although the drawings represent possible embodiments, the drawings are not necessarily to scale and certain features may be simplified, exaggerated, removed, or partially sectioned to better illustrate the embodiments.

Certain situations call for emulating an external monitor such that a computer functions as if it is connected an actual external monitor. For example, when two monitors are connected to a computer and there is no emulation of an external monitor, if a VGA connection to one monitor is intermittently lost, the operating system of the computer instructs the graphics card to stop sending an image signal to the monitor. The graphics card then rearranges the display of the missing monitor to appear on the other monitor. When the connection to the monitor is restored, the display might not be returned to the original arrangement, such that the user must make the adjustment. If the missing monitor were emulated during the lost connection, the display would not have been rearranged, saving the user from making the adjustment.

Accordingly, embodiments of the VGA monitor emulating PCB ensure the graphics card sends a VGA image signal, even when a VGA connection is lost or there is no VGA monitor. The PCB can be attached to a standard VGA cable and is independent of the operating system. Thus, the PCB can be used for a variety of applications that require a stable VGA connection or an external VGA monitor.

FIG. 1 illustrates an example of a printed circuit board (PCB) 10 that can be used with a video graphics array (VGA) connector 12, according to certain embodiments. PCB 10 can be plugged into VGA connector 12 to mimic an external VGA monitor. VGA connector 12 can carry any suitable video signals. In the example, VGA connector 12 carries analog red, green, blue, horizontal sync, vertical sync (RGBHV) video signals. VGA connector 12 includes pins 14 and a pin shield 16. Pins 14 carry the video signals and may also identify attached devices. Pins 14 includes video pins and return pins, where a video pin transmits video signals and a return pin provides a ground for a corresponding video pin. Shield 16 may protect pins and secure connector 12 to an external monitor. An external monitor is typically a computer display.

PCB 10 includes a substrate 19 configured to couple to VGA connector 12. Substrate 19 may be a PCB substrate of any suitable size and shape. In the example, substrate 19 is sized and shaped to fit within pin shield 16 of VGA connector 12, and can allow for a connection to an actual monitor. Electronic components (e.g., resistors) and electrical connections are disposed on substrate 19 to provide the functionality of PCB 10. Substrate 19 has openings, where each opening is configured to receive a pin 14 of VGA connector 12. Certain openings provide to a pin 14 within the opening an electrical connection to a particular electrical component of substrate 19. A more detailed description of the components and connections are described with reference to FIG. 3.

Figure 2:
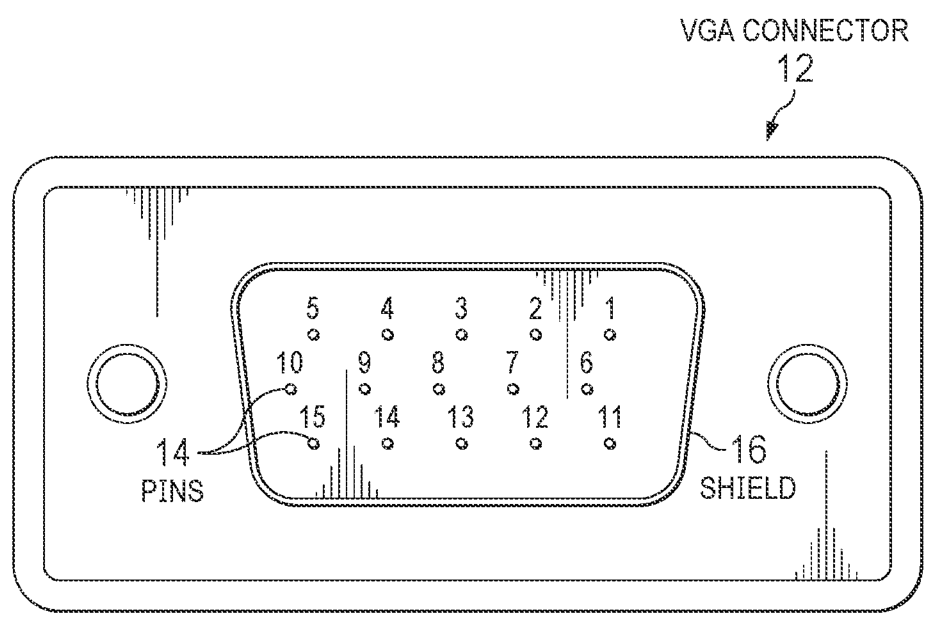
FIG. 2 illustrates an example of a VGA connector.

FIG. 2 illustrates an example of VGA connector 12 with pins 14. Pins 14 may have any suitable functions. An example of pin functions are described in TABLE 1.

TABLE 1

| Pin | NAME | Function |
|---|---|---|
| 1 | RED | Red video |
| 2 | GREEN | Green video |
| 3 | BLUE | Blue video |
| 4 | ID2/RES | Reserved |
| 5 | GND | Ground |
| 6 | RED_RTN | Red return |
| 7 | GREEN_RTN | Green return |
| 8 | BLUE_RTN | Blue return |
| 9 | KEY/PWR | Powers |
| 10 | GND | Ground |
| 11 | ID0/RES | Reserved |
| 12 | ID1/SDA | Data |
| 13 | HSync | Horizontal sync |
| 14 | VSync | Vertical sync |
| 15 | ID3/SCL | Clock |

Figure 3:
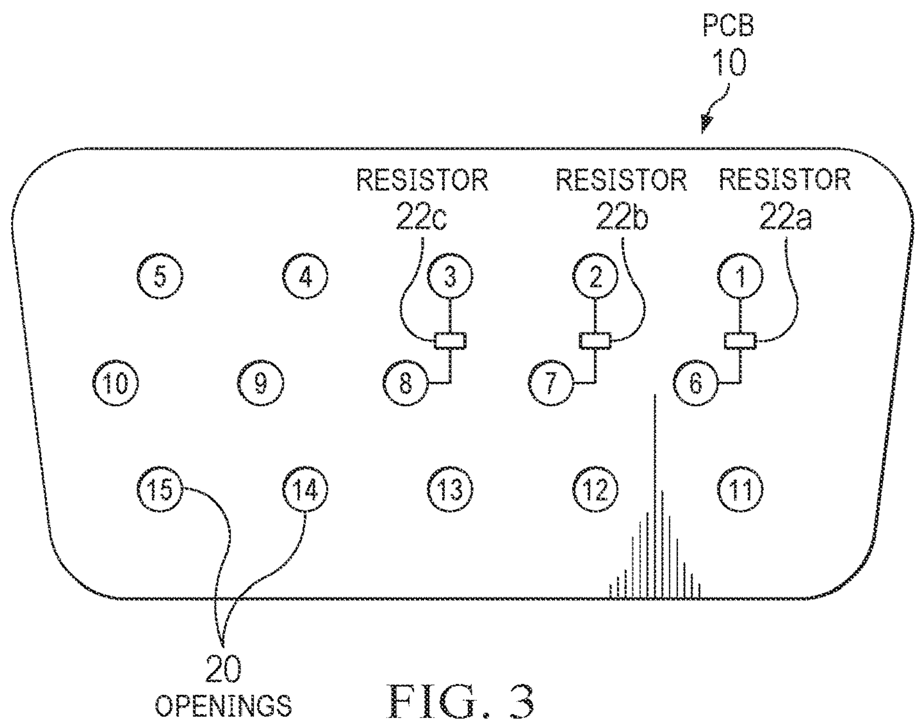
FIG. 3 illustrates an example of a PCB with openings and resistors, according to certain embodiments.

FIG. 3 illustrates an example of PCB 10 with openings 20 and resistors 22 (22*a*, 22*b*, 22*c*), according to certain embodiments. PCB 10 provides conductive pathways (e.g., metal) from selected pins 14 to resistors 22 and then to other selected pins 14 to mimic an external VGA monitor. When PCB 10 is plugged into VGA connector 12, PCB 10 operates as a parallel connection so that the computer perceives a resistance (e.g., approximately 75 Ohm resistance between pin 1/6 and/or pin 2/7 and/or 3/8) that causes the computer to identify PCB 10 as a monitor. Any suitable resistor 22 may be used, such as an integrated resistor with any suitable resistance, e.g., a resistance in a range of 30 to 150 Ohms, such as 50 to 100 Ohms, e.g., 75 Ohms.

Certain embodiments include resistors 22*a*, 22*b*, 22*c*, where a red connection resistor 22*a* couples a red video Pin 1 with a red return Pin 6; a green connection resistor 22*b* couples a green video Pin 2 with a green return Pin 7; and a blue connection resistor 22*c* couples a blue video Pin 3 with a blue return Pin 8. In other embodiments, depending on the graphics card and operating system, only one or two of the connections (e.g., green connection resistor 22*b*) are sufficient.

Figure 4A:
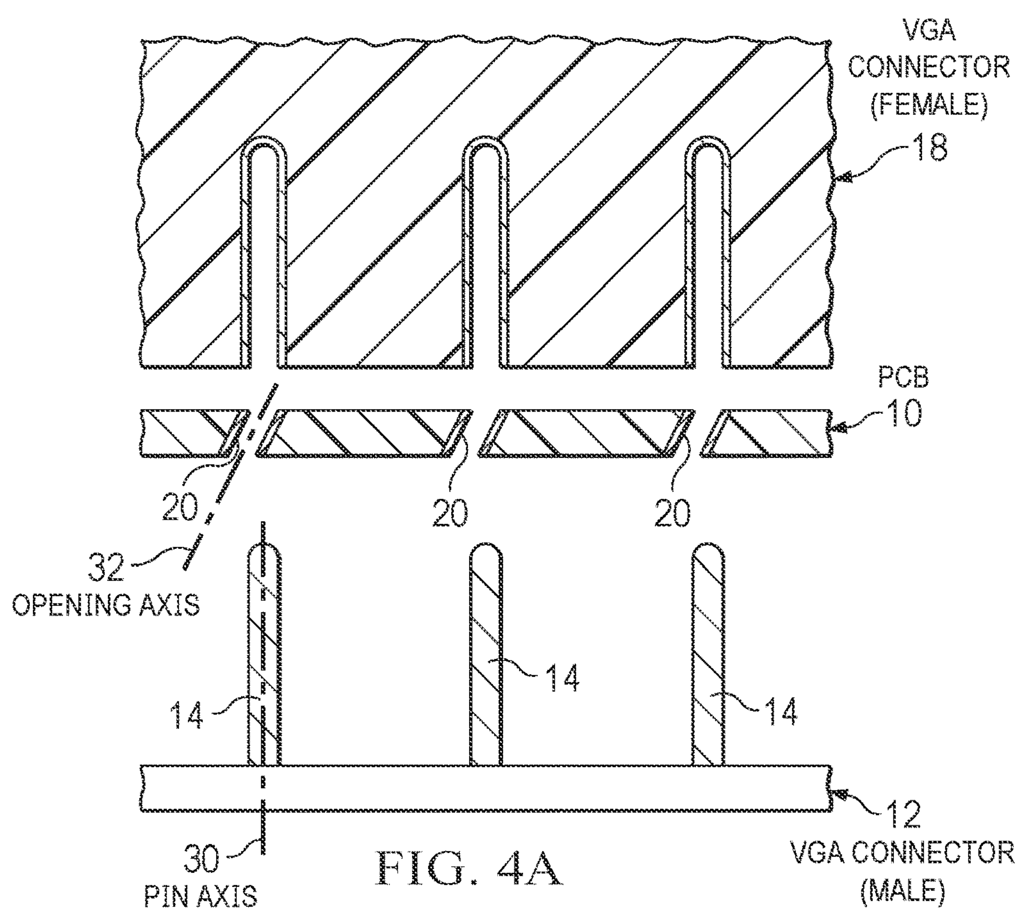
FIGS. 4A and 4B illustrate examples of PCBs that establish a stable electrical and mechanical connection to a VGA connector, according to certain embodiments.
Figure 4B:
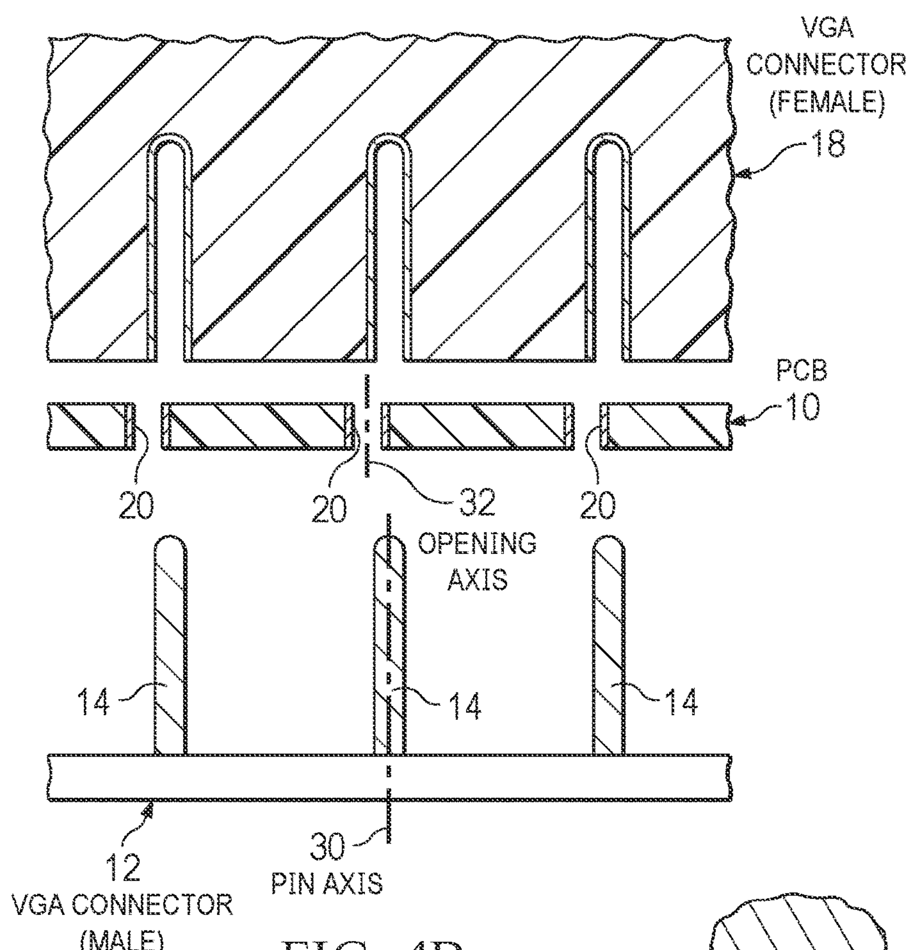

FIGS. 4A and 4B illustrate examples of PCBs 10 that establish a stable electrical and mechanical connection between PCB 10 and VGA connector 12, especially when coupled to a female VGA connector 18, according to certain embodiments. In the examples, an axis 32 of at least one opening 20 (such as one, two, or three openings) is not aligned with an axis 30 of the corresponding pin 14. At least part of the surface of the opening 20 presses against pin 14 to resist movement of pin 14 out from opening 20 to establish a stable connection between opening 20 and pin 14. In the illustrated examples, the inner surfaces of openings 20 and of the holes of female VGA connector 18, as well as pins 14 of VGA connector 12, comprise a conductive material such as metal.

In FIG. 4A, opening axis 32 is tilted at an angle relative to pin axis 30. The tilt angle may have any suitable value, such as an angle in the range of 1 to 5, 5 to 15, and/or 15 to 20 degrees. In FIG. 4B, opening axis 32 is offset at a distance relative to pin axis 30. The offset distance may have any suitable value, such as a distance in the range of 0.01 to 0.05, 0.05 to 0.1, 0.1 to 0.3, and/or 0.3 to 0.5 millimeters.

Figure 5:
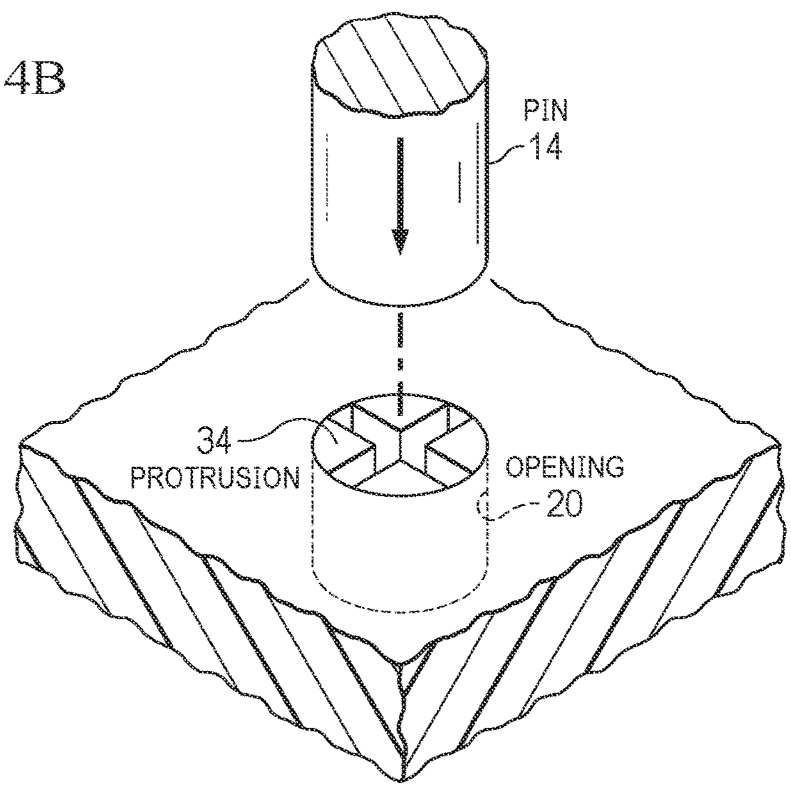
FIG. 5 illustrates an example of a PCB opening that establishes a stable electrical and mechanical connection with a VGA connector pin, according to certain embodiments.

FIG. 5 illustrates an example of an opening 20 of PCB 10 that establishes a stable electrical and mechanical connection with a pin 14 of VGA connector 12, according to certain embodiments. In the example, opening 20 includes one, two, three, or more protrusions 34 into opening 20. Protrusions 34 are sized and shaped to allow pin 14 to enter opening 20 and to resist movement of pin 14 out from opening 20. For example, a protrusion 34 may have an angled edge that points towards the center of opening that allows pin 14 to enter opening 20 and resists movement of pin 14 out from opening 20. The angle may have any suitable size, such as 60 to 120 degrees, e.g., 90 degrees.

A component (such as a computer coupled to the VGA connector) of the systems and apparatuses disclosed herein may include an interface, logic, and/or memory, any of which may include computer hardware and/or software. An interface can receive input to the component and/or send output from the component, and is typically used to exchange information between, e.g., software, hardware, peripheral devices, users, and combinations of these. A user interface is a type of interface that a user can utilize to communicate with (e.g., send input to and/or receive output from) a computer. Examples of user interfaces include a display, Graphical User Interface (GUI), touchscreen, keyboard, mouse, gesture sensor, microphone, and speakers.

Logic can perform operations of the component. Logic may include one or more electronic devices that process data, e.g., execute instructions to generate output from input. Examples of such an electronic device include a computer, processor, microprocessor (e.g., a Central Processing Unit (CPU)), and computer chip. Logic may include computer software that encodes instructions capable of being executed by an electronic device to perform operations. Examples of computer software include a computer program, application, and operating system.

A memory can store information and may comprise tangible, computer-readable, and/or computer-executable storage medium. Examples of memory include computer memory (e.g., Random Access Memory (RAM) or Read Only Memory (ROM)), mass storage media (e.g., a hard disk), removable storage media (e.g., a Compact Disk (CD) or Digital Video or Versatile Disk (DVD)), database, network storage (e.g., a server), and/or other computer-readable media. Particular embodiments may be directed to memory encoded with computer software.

Although this disclosure has been described in terms of certain embodiments, modifications (such as changes, substitutions, additions, omissions, and/or other modifications) of the embodiments will be apparent to those skilled in the art. Accordingly, modifications may be made to the embodiments without departing from the scope of the invention. For example, modifications may be made to the systems and apparatuses disclosed herein. The components of the systems and apparatuses may be integrated or separated, or the operations of the systems and apparatuses may be performed by more, fewer, or other components, as apparent to those skilled in the art. As another example, modifications may be made to the methods disclosed herein. The methods may include more, fewer, or other steps, and the steps may be performed in any suitable order, as apparent to those skilled in the art.

To aid the Patent Office and readers in interpreting the claims, Applicants note that they do not intend any of the claims or claim elements to invoke 35 U.S.C. § 112(f), unless the words "means for" or "step for" are explicitly used in the particular claim. Use of any other term (e.g., "mechanism," "module," "device," "unit," "component," "element," "member," "apparatus," "machine," "system," "processor," or "controller") within a claim is understood by the applicants to refer to structures known to those skilled in the relevant art and is not intended to invoke 35 U.S.C. § 112(f).

What is claimed:

1. A printed circuit board comprising:

a substrate configured to couple to a video graphics array connector, the video graphics array connector comprising a plurality of pins, the plurality of pins comprising a plurality of video pins and a plurality of return pins, a video pin configured to transmit a video signal, a return pin configured to provide a ground for a corresponding video pin, the substrate having a plurality of openings, each opening configured to receive a pin of the plurality of pins; and a plurality of resistors and a plurality of electrical connections disposed on the substrate, the resistors and the electrical connections configured to couple to a subset of the plurality of pins to mimic an external video graphics array monitor, the resistors comprising:

a red connection resistor configured to couple a red video pin with a red return pin configured to provide a ground for the red video pin;

a green connection resistor configured to couple a green video pin with a green return pin configured to provide a ground for the green video pin; and a blue connection resistor configured to couple a blue video pin with a blue return pin configured to provide a ground for the blue video pin.

2. The printed circuit board of claim 1, each resistor having a resistance between 30 to 150 Ohms.

3. The printed circuit board of claim 1, an axis of at least one opening set at an angle of 1 to 20 degrees relative to an axis of a pin.

4. The printed circuit board of claim 1, an axis of at least one opening translated 0.01 to 0.5 millimeters relative to an axis of a pin.

5. The printed circuit board of claim 1, at least one opening having one or more protrusions configured to secure a pin.

6. The printed circuit board of claim 5, a protrusion having an angular edge pointing towards the center of the at least one opening.

7. The printed circuit board of claim 1, the substrate sized and shaped to fit within a pin shield of the video graphics array connector.

8. A printed circuit board comprising:

a substrate configured to couple to a video graphics array connector, the video graphics array connector comprising a plurality of pins, the plurality of pins comprising a plurality of video pins and a plurality of return pins, a video pin configured to transmit a video signal, a return pin configured to provide a ground for a corresponding video pin, the substrate having a plurality of openings, each opening configured to receive a pin of the plurality of pins, an axis of at least one opening translated 0.01 to 0.5 millimeters relative to an axis of a pin; and a set of resistors and a set of electrical connections disposed on the substrate, the resistors and the electrical connections configured to couple to a subset of the set of pins to mimic an external video graphics array monitor, the set of resistors comprising one or more resistors, where each resistor is configured to couple a video pin with a corresponding return pin.

9. A printed circuit board comprising:

a substrate configured to couple to a video graphics array connector, the video graphics array connector comprising a plurality of pins, the plurality of pins comprising a plurality of video pins and a plurality of return pins, a video pin configured to transmit a video signal, a return pin configured to provide a ground for a corresponding video pin, the substrate having a plurality of openings, each opening configured to receive a pin of the plurality of pins, at least one opening having one or more protrusions configured to secure a pin; and a set of resistors and a set of electrical connections disposed on the substrate, the resistors and the electrical connections configured to couple to a subset of the set of pins to mimic an external video graphics array monitor, the set of resistors comprising one or more resistors, where each resistor is configured to couple a video pin with a corresponding return pin.

10. The printed circuit board of claim 9, a protrusion having an angular edge pointing towards the center of the at least one opening.

11. A printed circuit board comprising:

a substrate configured to couple to a video graphics array connector, the video graphics array connector comprising a plurality of pins, the plurality of pins comprising a plurality of video pins and a plurality of return pins, a video pin configured to transmit a video signal, a return pin configured to provide a ground for a corresponding video pin, the substrate sized and shaped to fit within a pin shield of the video graphics array connector, the substrate having a plurality of openings, each opening configured to receive a pin of the plurality of pins; and a set of resistors and a set of electrical connections disposed on the substrate, the resistors and the electrical connections configured to couple to a subset of the set of pins to mimic an external video graphics array monitor, the set of resistors comprising one or more resistors, where each resistor is configured to couple a video pin with a corresponding return pin.

12. The printed circuit board of claim 11, a resistor of the set of resistors comprising:

a red connection resistor configured to couple a red video pin with a red return pin.

13. The printed circuit board of claim 11, a resistor of the set of resistors comprising:

a green connection resistor configured to couple a green video pin with a green return pin.

14. The printed circuit board of claim 11, a resistor of the set of resistors comprising:

a blue connection resistor configured to couple a blue video pin with a blue return pin.

15. The printed circuit board of claim 11, each resistor having a resistance between 30 to 150 Ohms.

16. The printed circuit board of claim 11, an axis of at least one opening set at an angle of 1 to 20 degrees relative to an axis of a pin.

17. The printed circuit board of claim 11, an axis of at least one opening translated 0.01 to 0.5 millimeters relative to an axis of a pin.

18. The printed circuit board of claim 11, at least one opening having one or more protrusions configured to secure a pin.

19. The printed circuit board of claim 18, a protrusion having an angular edge pointing towards the center of the at least one opening.

* * * * *